(12) United States Patent
Bryant et al.

(10) Patent No.: US 6,512,269 B1
(45) Date of Patent: Jan. 28, 2003

(54) HIGH-VOLTAGE HIGH-SPEED SOI MOSFET

(75) Inventors: Andres Bryant, Essex Junction, VT (US); Edward Joseph Nowak, Essex Junction, VT (US); Minh Ho Tong, Fuquay-Varina, NC (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 09/657,315

(22) Filed: Sep. 7, 2000

(51) Int. Cl.[7] .................. H01L 27/01; H01L 27/12; H01L 29/76; H01L 29/94
(52) U.S. Cl. .............. 257/347; 257/350; 257/365; 257/401
(58) Field of Search ............... 257/347, 350, 257/351, 365, 401

(56) References Cited

U.S. PATENT DOCUMENTS

| | | | |
|---|---|---|---|
| 3,845,495 A | 10/1974 | Cauge et al. | 257/336 |
| 5,113,236 A | 5/1992 | Arnold et al. | 257/347 |
| 5,378,912 A | 1/1995 | Pein | 257/335 |
| 5,442,209 A | * 8/1995 | Chung | 257/401 |
| 5,580,802 A | 12/1996 | Mayer et al. | 438/157 |
| 5,686,755 A | 11/1997 | Malhi | 257/492 |
| 5,710,451 A | 1/1998 | Merchant | 257/347 |
| 5,874,768 A | 2/1999 | Yamaguchi et al. | 257/493 |

FOREIGN PATENT DOCUMENTS

| | | | | |
|---|---|---|---|---|
| JP | 60-257150 | * | 12/1985 | 257/401 |
| SU | 3370210 A | | 4/1987 | 257/401 |

* cited by examiner

*Primary Examiner*—Steven Loke
(74) *Attorney, Agent, or Firm*—Scully, Scott, Murphy and Presser; Mark F. Chadurjian

(57) ABSTRACT

A semiconductor device including an SOI substrate; a plurality of diffusion regions in substrate, separated by, and abutting a plurality of body regions in said substrate, a first one of the body regions and its abutting diffusion regions having a first width and successive ones of the body regions and their abutting diffusion regions having successively smaller widths; and a plurality of gates each over one of the plurality of body regions and separated from the body regions by a dielectric material, said plurality of gates connected to a common voltage terminal.

12 Claims, 3 Drawing Sheets

HIGH-VOLTAGE HIGH-SPEED SOI MOSFET

FIELD OF THE INVENTION

The present invention relates to semiconductor devices and more particularly to high-voltage high-speed semiconductor devices that include at least a silicon-on-insulator (SOI) substrate having at least two or more metal oxide semiconductor field effect transistors (MOSFETs) formed in the active region of the SOI substrate. The present invention is also directed to a process of fabricating a high-voltage high-speed SOI-containing device as well as a circuit which contains the same.

BACKGROUND OF THE INVENTION

High-speed SOI complementary metal oxide semiconductor (CMOS) and, in particular, partially-depleted SOI (PDSOI) technology requires thin (20 to 300 nm) body thickness in order to provide speed advantages to CMOS circuits. Unfortunately, this very constraint on body thickness also places numerous tradeoffs and compromises in fabrication of coexisting high-voltage devices which frequently are required for higher-voltage interfaces for input/output functions or for non-volatile random access memory (RAM) drivers embedded in high-speed circuitry. For example, tradeoffs and compromises in areas such as breakdown voltage, on-resistance and manufacturing ease and reliability may have to be made and taken into consideration when designing and fabricating a high-voltage high-speed semiconductor device. As is known to those skilled in the art, improving one parameter, such as, for example, breakdown voltage, will result in the degradation of another parameter such as on-resistance. In an ideal high-voltage high-speed semiconductor device, no tradeoffs and compromises would be made.

In today's generation of high-voltage high-speed semiconductor devices, SOI devices are replacing their bulk Si counterparts since SOI devices provide higher performance, little or no latch-up and higher packing density. In SOI technology, a relatively thin layer of semiconducting material, e.g., Si, overlays a layer of insulating material, e.g., a buried oxide region. This relatively thin semiconductor layer, which is referred to herein as the active region of the SOI substrate, is generally the area in which active devices are fabricated. For example, in high-performance SOI logic devices, the logic devices, i.e., MOSFETs, are built within this relatively thin Si region of the SOI substrate to minimize source/drain capacitance.

Despite the advantages obtained using SOI technology, prior art high-speed SOI devices are not able to withstand high operating voltage, i.e., breakdown voltages of 3V or above. Instead, the maximum operating voltage in prior art high-speed SOI devices has been limited to less than 2.5V. This is because the body of the MOSFET in such prior art high-voltage semiconductor devices is floating, or at best connected to a ground potential via a very high-resistance which in turn gives to relatively low drain-to-source breakdown voltage, $V_{bds}$.

Moreover, when high-operating voltages are employed in prior art high-voltage high-speed SOI semiconductor devices, the drain of the MOSFET leaks current into the source, via the body, which causes the device to breakdown.

In view of the drawbacks with prior art high-voltage high-speed SOI semiconductor devices, there is a continued need for developing new and improved SOI semiconductor devices in which higher operating voltages than heretofore possible with prior art SOI semiconductor devices can be employed. That is, an SOI semiconductor device is needed which exhibits a $V_{bds}$, that is above 2.5V, preferably above 3V.

SUMMARY OF THE INVENTION

One aspect of the present invention relates to a high-voltage high-speed SOI semiconductor device which comprises:

an SOI substrate including at least an active region disposed on an electrically insulating region;

a plurality of diffusion regions in said active region, separated by, and abutting a plurality of body regions in said active region, a first one of the body regions and its abutting diffusion regions having a first width and successive ones of the body regions and their abutting diffusion regions having successively smaller widths; and a plurality of gates each over one of the plurality of body regions and separated from the body regions by a dielectric material, said plurality of gates connected to a common voltage terminal.

In the present invention, the diffusions between gate regions extend vertically through the entire active region of the SOI substrate.

In one embodiment of the present invention, the diffusion region at the first terminal end of the SOI semiconductor device is a drain terminal and the diffusion region at the other terminal end of the device is a source terminal.

Another aspect of the present invention relates to a circuit which comprises:

a first field effect transistor, said first field effect transistor including a first source, a first drain, a first gate and having a first channel width; and a second field effect transistor, said second field effect transistor including a second drain coupled to the first source, a second source, a second gate electrically coupled to said first gate, and a second channel width smaller than the first channel width.

In one embodiment of the present invention, the circuit includes a third field effect transistor comprising a third drain region coupled to the second source region, a third source region, a third gate electrically coupled to the first and second gates, and a third channel width smaller than the second channel width. Additional field effect transistors may also be employed in the present invention and the circuit would follow the above design pattern.

A yet further aspect of the present invention relates to a method of forming the above-mentioned high-voltage high-speed SOI semiconductor device. Specifically, the method of the present invention comprises the steps of:

(a) providing a structure including an SOI substrate having at least two patterned gate stack regions on a surface thereof, said SOI substrate having an active region on a buried oxide region;

(b) forming an oxide layer on all exposed surfaces of said structure;

(c) selectively masking a portion of said structure, whereby a first terminal portion of said structure is left exposed;

(d) forming a first diffusion region in said active region of said SOI substrate by ion implanting through said first terminally exposed portion of said structure;

(e) forming a plurality of diffusion regions of the same conductivity type as that of said first diffusion region in said active region of said SOI substrate by ion implanting through portions of said structure not covered by said gate stack;

(f) selectively masking a portion of said structure, whereby the active regions between the gate stacks are exposed; and (g) forming a deep diffusion region in said active regions by ion implanting through said exposed portion of said substrate.

Optional shallow extension, halo, and/or deep implant steps may be employed in the present invention prior to conducting step (d) above. In accordance with the present invention, each of these diffusion regions would have a width smaller than the first diffusion region.

DESCRIPTION OF THE INVENTION

Figure 1:
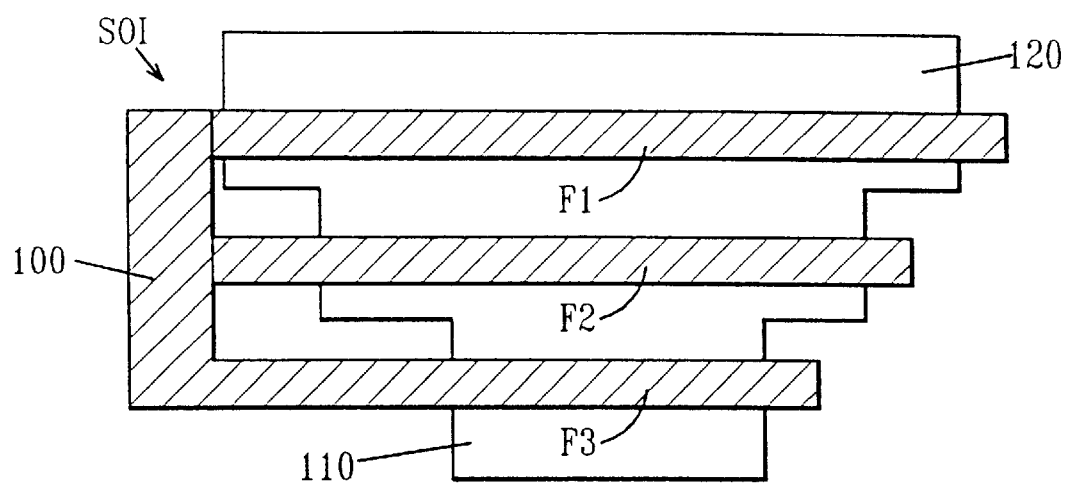
FIG. 1 is a design layout for a high-voltage high-speed SOI semiconductor device of the present invention.

The present invention which provides a high-voltage high-speed SOI semiconductor device having a higher-breakdown voltage as compared to prior art high-performance SOI semiconductor devices will now be described in greater detail by referring to the drawings that accompany the present invention.

Reference is first made to FIG. 1 which is a basic design layout of the inventive high-voltage high-speed SOI semiconductor structure of the present invention. Specifically, FIG. 1 shows a top surface of an SOI substrate which includes gate region 100, source region 110 and drain region 120. As shown in FIG. 1, each device finger, F1, F2 and F3 has a variable width layout which ensures that the voltage drop across each finger is uniform. Moreover, in the design layout of the present invention, the MOSFET that has the most positive source potential of the stack will have the greatest width, while the MOSFET that has the least positive source potential of the stack will have the least width. Similarly, for stacks greater than two MOSFETs high, the width of the MOSFET will vary proportionately to the source voltage of the MOSFET. In FIG. 1, the drain is depicted as having a wider width than the source.

The design layout illustrated in FIG. 1 overcomes the problems with prior art high-voltage high-speed SOI semiconductor devices and thus provides a high-voltage high-speed SOI semiconductor device that can operate at voltages greater than 2.5V, preferably at voltages of than 3V. This represents a significant improvement over prior art SOI semiconductor devices in that in such devices the operating voltage is limited to below 2.5V.

Figure 2:
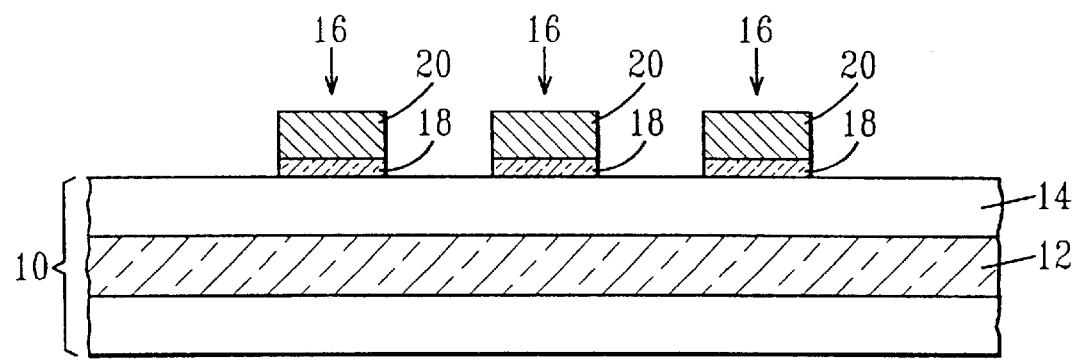
FIGS. 2–7 are pictorial views illustrating the basic processing steps of the present invention which are employed in fabricating a high-voltage high-speed SOI semiconductor device.

FIGS. 2–7 illustrate the basic processing steps that are implemented in the present invention in achieving the above design layout. Turning to FIG. 2, there is illustrated one type of initial structure that can be employed in the present invention. Specifically, FIG. 2 comprises SOI substrate 10 having buried oxide region 12 and Si active region 14 on the buried oxide region. The structure of FIG. 2 further includes a patterned gate stack 16 formed on the surface of active region 14. The patterned gate stack includes at least a gate dielectric 18 and a gate conductor 20.

The structure shown in FIG. 2 includes conventional materials well known to those skilled in the art and it is fabricated utilizing conventional gate processing techniques that are also well known to those skilled in the art. The following description is a basic illustration of the materials and techniques that could be employed in fabricating the structure of FIG. 2. Other materials and techniques besides those mentioned hereinbelow which are capable of providing the structure shown in FIG. 2 are also contemplated herein.

The structure shown in FIG. 2 may be formed by depositing a relatively thick layer of gate dielectric 18 on the surface of the SOI substrate, i.e., on active region 14. The term "relatively thick" denotes a gate dielectric having a thickness that is large enough to ensure reliable operation over voltage conditions and lifetime of the product. Preferably, the thickness of the gate dielectric is from about 20 to about 100 Å. A thick gate dielectric layer is preferred in the present invention over a thin gate dielectric since a thicker gate dielectric can substantially prevent current from leaking into the active region of the SOI substrate and furthermore allows high voltages (>2.5V) to be safely applied across the gate oxide while maintaining good reliability.

The gate dielectric is formed by a conventional deposition process such as chemical vapor deposition (CVD), plasma-assisted CVD, sputtering, evaporation, chemical solution deposition or other like deposition processes, or alternatively, the gate dielectric is formed by a thermal growing process.

The gate dielectric may be patterned at this stage by conventional lithography and etching or the entire gate stack, after deposition of the gate dielectric and the gate conductor, may be patterned at the same time. The latter is preferred herein since it reduces the number of processing steps used in fabricating the patterned gate conductor. The lithography step employed in the present invention includes applying a photoresist, patterning the photoresist, and developing the pattern. The etching step includes the use of any dry etch process such as reactive-ion etching, plasma-etching and ion-beam etching.

The gate dielectric is composed of any dielectric material such as, but not limited to: oxides, nitrides, oxynitrides, so-called high-k dielectrics such as $Al_2O_3$ or $ZrO_2$ and any combination or multilayer thereof. A preferred gate dielectric of the present invention is $SiO_2$.

Next, a gate conductor is formed on the gate dielectric layer (patterned or unpatterned) by utilizing a conventional deposition process including, but not limited to: CVD, plasma-assisted CVD, sputtering, spin-on coating, plating, evaporation and other like deposition processes. The gate conductor may be composed of any conductive material including, but not limited to: polysilicon, elemental metals such as Cu, W, Pt, Au, Ag, Ta, and nitrides thereof. When polysilicon is employed as the gate conductor, the polysilicon is typically doped polysilicon which is doped either in-situ utilizing a conventional doping deposition process, or alternatively, the doping may occur after deposition of the polysilicon layer by utilizing a conventional ion implantation process.

The thickness of the gate conductor is not critical to the present invention, but typically, the gate conductor has a thickness of from about 100 to about 200 nm. More important than the thickness of the gate conductor is the gate length that is obtained after patterning the gate stack. Specifically, the length of the gate conductor after patterning is from about 30 to about 300 nm.

Another important feature of the present invention is that the high-voltage high-speed SOI semiconductor device has an unusual aspect ratio of gate conductor length to gate dielectric thickness, i.e., $L_{gate}/T_{dielectric}$, of from about 10:1 to about 30:1.

Figure 3:
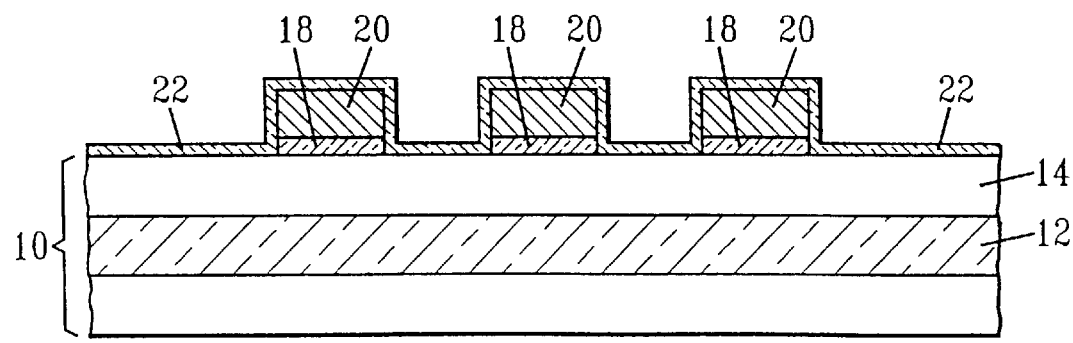

After patterning the gate conductor stack, oxide layer 22 is formed on all exposed surfaces of the structure including the patterned gate stack and the active region of the SOI substrate by utilizing a conventional gate oxidation process. The structure after formation of oxide layer 22 is shown in FIG. 3.

Specifically, the gate oxidation process employed in the present invention is carried out in an oxidizing atmosphere at a temperature of greater than 700° C. The thickness of the gate oxide layer is variable and is not critical to the present invention, but typically the oxide layer has a thickness of from about 20 to about 90 Å.

It should be noted that although the drawings of the presence invention depict the presence of three patterned gate stack regions, the present invention is not limited to that number. Instead, the present invention requires that at least two patterned gate stacks be present in the structure. Moreover, it is emphasized that the patterned gate stack regions together with the subsequently formed diffusion regions form MOSFET regions in the inventive structure which are formed in the active region of the SOI substrate. The portion of the active region of the SOI substrate that underlays the patterned gate stack is channel region of the MOSFET and is herein referred to as the body of the device.

Figure 4:
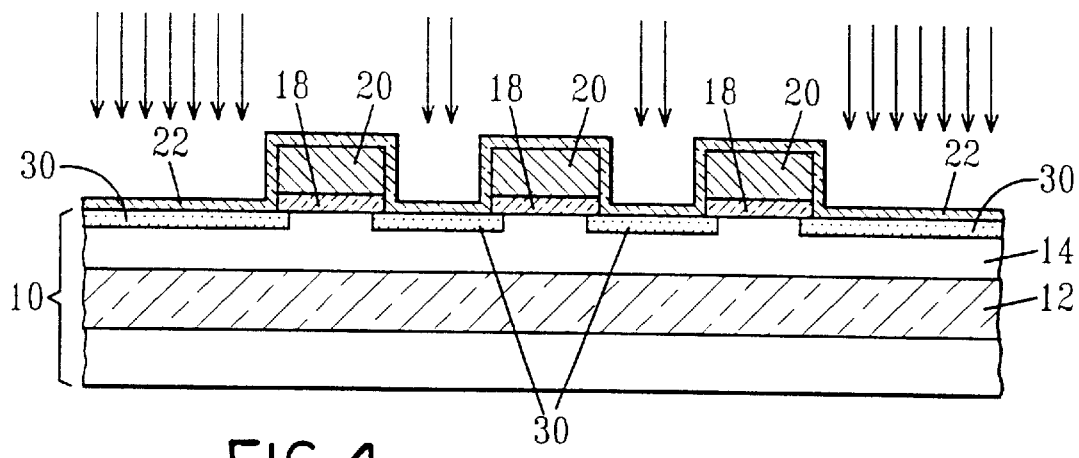

Optional implants to form shallow extensions and halos in the active region of the SOI substrate adjacent to all of the (two or more) gate stacks may be performed at this point of the process. The structure after conducting these optional implant steps is shown in FIG. 4.

The shallow extensions 30 are formed in the active region of the SOI substrate by utilizing a low energy implantation, typically a dosage of arsenic from about $1 \times 10^{14}$ to about $1 \times 10^{15}$ atoms/cm$^2$ using an energy from about 1 to about 20 keV, or for p-type MOSFETs, a dosage of boron difluoride from about $1 \times 10^{14}$ to about $1 \times 10^{15}$ atoms/cm$^2$ using an implant energy from about 1 to about 10 keV is preferred.

The halo implant for n-type MOSFETs is carried out utilizing conventional halo implant conditions which typically consist of a boron implantation having a boron dose of $1 \times 10^{13}$ to $5 \times 10^{13}$ atoms/cm$^2$ using an implant energy of from about 5 to about 30 keV. No halo implant is preferred in the case of p-type MOSFETs.

Figure 5:
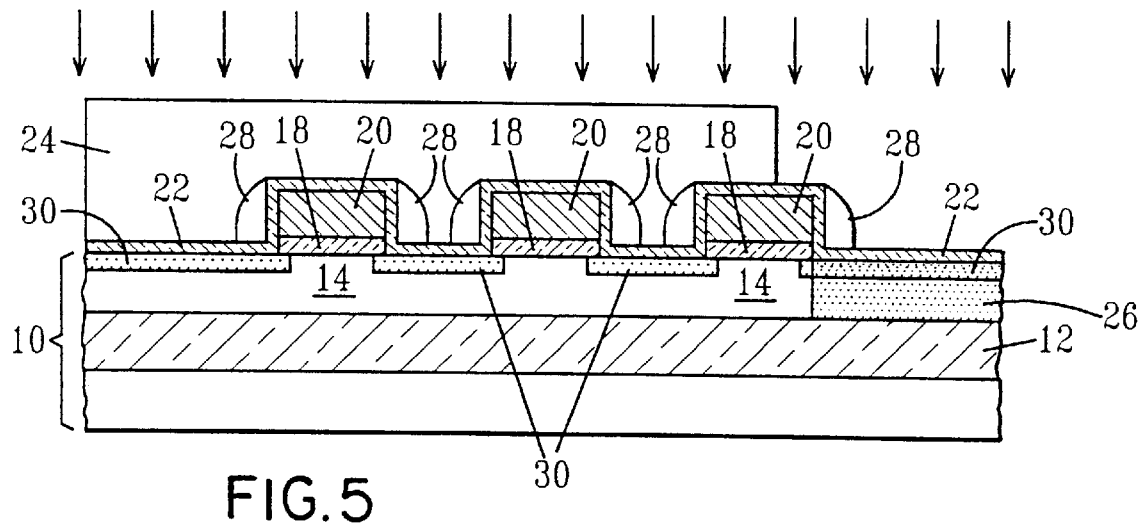
Figure 6:
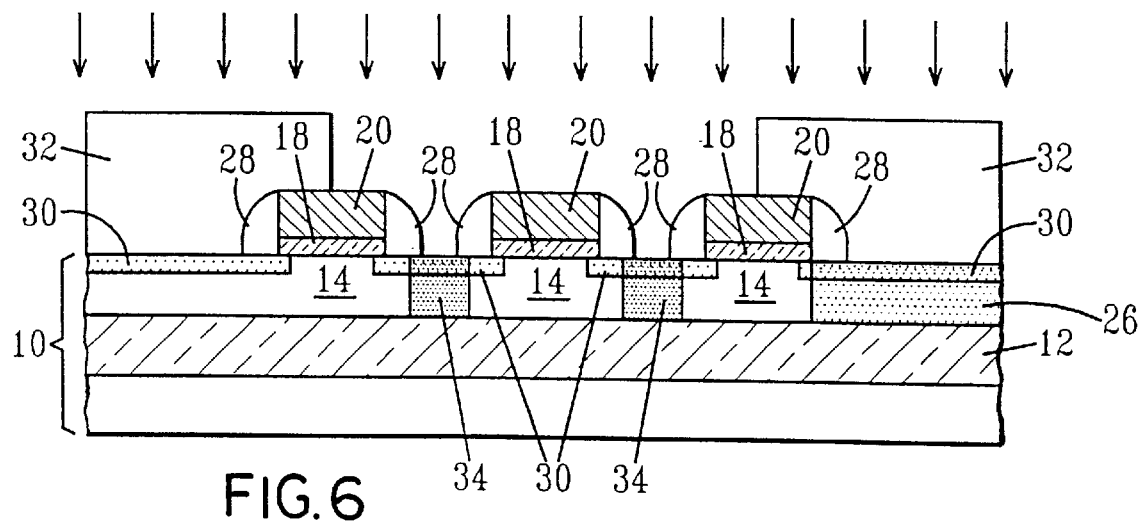
Figure 7:
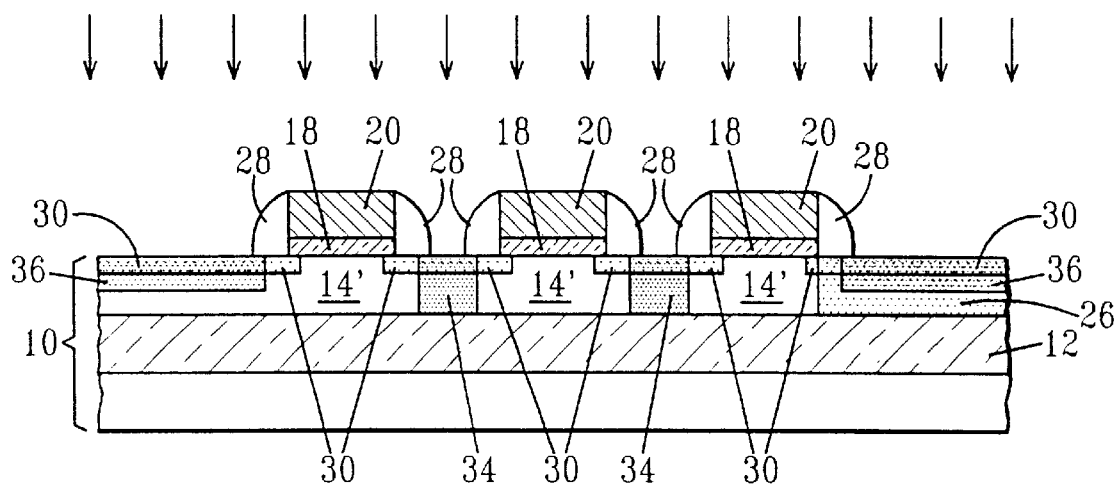

Sidewall spacers 28 shown in FIGS. 5–7 are formed on the exposed sidewalls of the patterned gate conductor by depositing a dielectric material such as $SiO_2$ or $Si_3N_4$ on all exposed surface of the structure and thereafter performing an anisotropic etching process that is capable of forming spacers on the sidewalls of the patterned gate conductor. The sidewalls spacers which are illustrated FIGS. 5–7 of the present invention have a thickness of from about 50 to about 130 nm. It is noted that the etching process used in forming the spacers removes oxide layer 22 from the structure.

Next, as shown in FIG. 5, mask 24 is formed on selective portions of the structure blocking a predetermined portion of the structure, while leaving a terminal portion of the structure exposed. The mask is formed utilizing conventional lithography.

A first diffusion region 26 is then formed through the exposed terminal portion of the structure, See FIG. 5, utilizing a conventional ion implantation process. The first diffusion region which is the drain terminal diffusion region of the device is characterized as having a larger width than the other diffusion regions to be subsequently formed in the structure. After formation of the first diffusion region in the active region of the SOI substrate, the mask is stripped utilizing a conventional stripping process well known to those skilled in the art.

FIG. 6 shows another optional embodiment of the present invention wherein block mask 32 and a high-energy, high ion dose implantation process is employed to form extremely deep diffusion implant regions 34 in the structure which extend to the underlying buried oxide region of the SOI substrate; i.e., regions 34 extend vertically through the entire active region of the SOI substrate stopping on region 12. The high-energy, high ion dose implantation process is typically carried out utilizing an ion, preferably arsenic for n-type FETs and $BF_2$ for p-type FETs, dosage of from about $1 \times 10^{15}$ to about $1 \times 10^{16}$ atoms/cm$^2$ and an energy of from about 10 to about 30 kev for arsenic, or from about 3 to about 12 keV for $BF_2$. This step may be omitted if the subsequent implant step provides a deep implant.

Next, as shown in FIG. 7, second diffusion region 36 having the same conductivity as the first diffusion region is formed in the other terminal portion of the structure opposite to the first terminal portion utilizing a conventional ion implantation process which is capable of forming a second diffusion region that has a width that is smaller than the first diffusion region. It is noted that FIG. 7 is a representation of the high-voltage high-speed SOI semiconductor device of the present invention.

Specifically, the structure shown in FIG. 7 includes a plurality of diffusion regions (26, 34 and 36) in SOI substrate 10 which are separated and abutting a plurality of body regions 14' in said substrate, a first one of the body regions and its abutting diffusion regions having a first width and successive second body regions and their abutting diffusion regions having successively smaller widths. Since the widths of the body regions of the SOI device underneath each MOSFET is successively smaller than the proceeding width, the channel width beneath each successive gate is also smaller. This feature together with the use of the thick gate dielectric permits the SOI semiconductor device of the present invention to operate higher voltages than heretofore possible with prior art SOI semiconductor devices.

Figure 8:
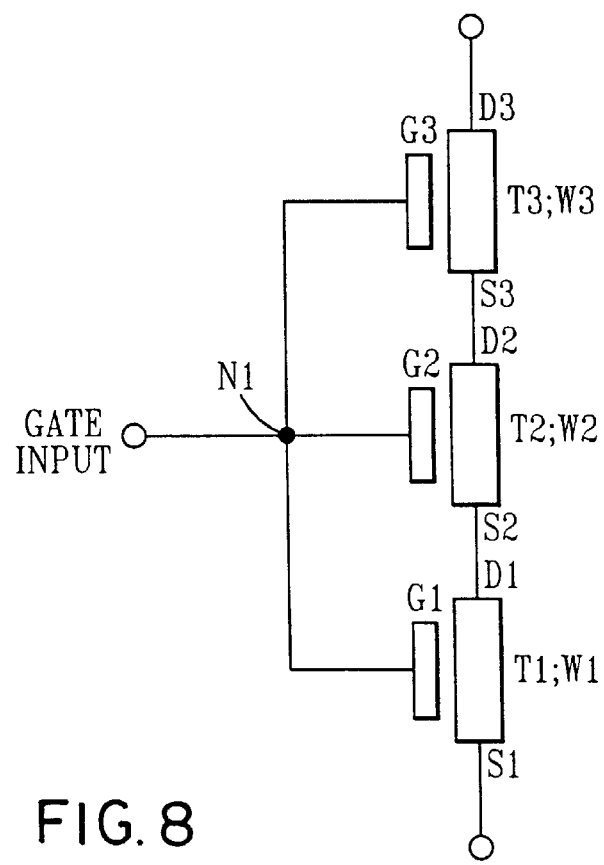
FIG. 8 is a schematic of the inventive circuit of the present invention.

FIG. 8 shows a basic circuit schematic of the high-voltage high-speed SOI device of the present invention. Specifically, the circuit schematic illustrated in FIG. 8 includes a plurality of FETs (T1, T2 and T3) having channels widths W1, W2 and W3, respectively, wherein W1>W2>W3, and each gate (G1, G2, G3) of the FETs being electrical connected through common node, N1. Each FET includes source regions (S1, S2 or S3) and drain regions (D1, D2 and D3) configured in the manner illustrated. As shown, the drain region of T3 forms one terminal end of the circuit and the source region of T1 forms the other terminal end of the circuit. In the circuit design illustrated, an input signal from a gate input region will be transmitted to each FET through the common node. Moreover, the narrowest source region would have the lowest voltage of the source/drain terminals in the device.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. An silicon-on-insulator semiconductor device comprising:
   an silicon-on-insulator substrate including at least an active region disposed on an electrically insulating region;
   a plurality of diffusion regions in said active region, separated by, and abutting a plurality of body regions in said substrate, a first one of the body regions and its abutting diffusion regions having a first width and successive ones of the body regions and their abutting diffusion regions having successively smaller widths; and
   a plurality of gate conductors each over one of the plurality of body regions and separated from the body regions by a dielectric material, wherein said plurality of gate conductors and said dielectric have an aspect ratio in terms of gate conductor length to dielectric material thickness of from about 10:1 to about 30:1, and wherein said silicon-on-insulator semiconductor device has a drain-to-source breakdown voltage of at least approximately 2.5V.

2. The silicon-on-insulator semiconductor device of claim 1 wherein a diffusion region at a first end has a drain terminal and a diffusion region at a second end has a source terminal.

3. The silicon-on-insulator semiconductor device of claim 1 further comprising diffusion regions between gate conductor that extend vertically through the entire active region of the substrate.

4. The silicon-on-insulator semiconductor device of claim 1 wherein said plurality of gate conductors are each disposed on respective said dielectric material.

5. The SOI semiconductor device of claim 4 wherein each of said gate conductors is a conductive material selected from the group consisting of polysilicon, elemental metals and nitrides of elemental metals.

6. The SOI semiconductor device of claim 5 wherein said gate conductor is composed of polysilicon.

7. The silicon-on-insulator semiconductor device of claim 1 wherein said plurality of gate conductor each include sidewall spacers thereon.

8. The SOI semiconductor device of claim 7 wherein said sidewall spacers are composed of $SiO_2$ or $Si_3N_4$.

9. The silicon-on-insulator semiconductor device of claim 1 wherein said dielectric material is a thick dielectric having a thickness of from about 20 to about 100 Å.

10. The silicon-on-insulator semiconductor device of claim 1 wherein said dielectric is selected from the group consisting of oxides, nitrides, oxynitrides, $Al_2O_3$, $ZrO_2$ and mixtures or multilayers thereof.

11. The silicon-on-insulator semiconductor device of claim 1 wherein said plurality of gate conductor each have a gate length of from about 30 to about 300 nm.

12. The SOI semiconductor device of claim 1, wherein said device has a first end and a second end, and wherein
   a first one of said plurality of diffusion regions at said first end has a first depth; and
   a second one of said plurality of diffusion regions at said second end has a second depth different from said first depth.

* * * * *